United States Patent [19]
Kumamoto et al.

[11] Patent Number: 5,731,776
[45] Date of Patent: Mar. 24, 1998

[54] ANALOG-TO-DIGITAL CONVERTER

[75] Inventors: Toshio Kumamoto; Osamu Matsumoto, both of Tokyo, Japan

[73] Assignee: Mitsubishi Denki Kabushiki Kaisha, Tokyo, Japan

[21] Appl. No.: 714,423

[22] Filed: Sep. 16, 1996

[30] Foreign Application Priority Data

Mar. 27, 1996 [JP] Japan ................... 8-072042

[51] Int. Cl.$^6$ ................................... H03M 1/36
[52] U.S. Cl. ........................... 341/159; 341/155
[58] Field of Search ........................ 341/159, 156, 341/155

[56] References Cited

U.S. PATENT DOCUMENTS 5,554,989  9/1996  Kumamoto et al. ............ 341/159

OTHER PUBLICATIONS

IEEE Journal of Solid–State Circuits, vol. 29, No. 4, pp. 516–522, Apr. 4, 1994, T. Miki, et al., "A 10–b 50 MS/s 500–mW A/D Converter Using a Differential–Voltage Subconverter".

Primary Examiner—Brian K. Young
Attorney, Agent, or Firm—Oblon, Spivak, McClelland, Maier & Neustadt, P.C.

[57] ABSTRACT

A ladder resistance (1) consisting of resistance elements (r1, r2, ..., r8) connected in series with intermediate taps (T1, T2, ..., T7) interposed is so arranged as to be folded back at its midpoint. Pairs of differential comparators (C1 and C7, C2 and C6, ...) which are connected to common intermediate taps are each disposed adjacently so as to be nearest to the intermediate tap to be connected thereto. Accordingly, wires connecting the differential comparators (C1, C2, ..., C7) to the intermediate taps (T1, T2, ..., T7) become shorter and an area of a semiconductor chip needed for arranging the wires can be reduced. Thus, reduction in area of the semiconductor chip needed for providing the device therein is achieved.

20 Claims, 11 Drawing Sheets

5,731,776

ANALOG-TO-DIGITAL CONVERTER

BACKGROUND OF THE INVENTION

1. Field of the Invention

The present invention relates to an analog-to-digital (A/D) converter, and more particularly to an improvement in a technique to reduce the area of a semiconductor chip in which the device is fabricated.

2. Description of the Background Art

FIG. 11 is a wiring diagram of a background-art A/D converter. A device 151 shown in FIG. 11 is fabricated within a single semiconductor substrate (semiconductor chip). The device 151 includes N differential comparators C1, C2, ..., C(N), each of which has four input terminals, i.e., the first to fourth input terminals as shown in FIG. 11. Outputs from all of the differential comparators C1, C2, ..., C(N) are inputted to an encoder 10.

The device 151 further includes a ladder resistance 51. The ladder resistance 51 includes a pair of terminals 52 and 53 and resistance elements r1, r2, ..., r(N+1) connected in series to one another between the terminals. At the junctions of the resistance elements r1, r2, ..., r(N+1) provided are intermediate taps T1, T2, ..., T(N), respectively.

In the differential comparator C(i) (i=1, ..., N), the first input terminal is connected to the intermediate tap T(i) provided at the junction between the resistance elements r(i) and r(i+1) and the second input terminal is connected to the intermediate tap T(N+1−i) provided at the junction between the resistance elements r(N+2−i) and r(N+1−i). In other words; the first input terminal of the differential comparator C(i) and the second input terminal of the differential comparator C(N+1−i) are connected in common to the intermediate tap T(i).

The device 151 further includes a pair of differential input signal lines 55 and 56 connected to terminals 57 and 58 respectively at one ends. The third input terminal of each of the differential comparator C1, C2, ..., C(N) is connected to the differential input signal line 55 and the fourth input terminal of each of the differential comparators C1, C2, ..., C(N) is connected to the differential input signal line 56.

Each of the differential comparators C1, C2, ..., C(N) compares the difference between input voltage signals applied to its third input terminal and fourth input terminal with the difference between input voltage signals applied to its first input terminal and second input terminal, and outputs a digital signal of high level or low level depending on the comparison result.

The terminal 52 is supplied with a reference potential VRB on lower potential side and the terminal 53 is supplied with a reference potential VRT on higher potential side by an external reference voltage supply circuit. The terminals 57 and 58 receive a pair of differential input voltage signals Vi and $\overline{\text{Vi}}$, respectively. The differential input voltage signal $\overline{\text{Vi}}$ is an inverted signal of the differential input voltage signal Vi. Accordingly, the differential comparators C1, C2, ..., C(N) compare the difference Vin between the input voltage signals Vi and $\overline{\text{Vi}}$ with divided reference voltages V1, V2, ..., V(N) respectively into which the reference voltage is divided with the ladder resistance 51 and output the signals of high level or low level depending on the respective comparison results.

The magnitude of divided reference voltage becomes larger in the order of V1, V2, ..., V(N) at equal intervals. For example, if the difference Vin between the input voltage signals Vi and $\overline{\text{Vi}}$ is higher than the divided reference voltage V(N/2) and lower than the divided reference voltage V(N/2+1), the differential comparators C1, ..., C(N/2) output signals of high level and the differential comparators C(N/2+1), ..., C(N) output signals of low level.

The encoder 10 converts these groups of signals of high level and low level outputted from the differential comparators C1, C2, ..., C(N) into a digital signal which represents a numerical value in binary notation and outputs the digital signal as an output signal OUT. In this manner, the device 151 converts the difference Vin between the analog differential input voltage signals Vi and $\overline{\text{Vi}}$ into the digital signal to output it.

Having the above configuration, the background-art device 151 presents a problem as follows: Connecting the differential comparators C1, C2, ..., C(N) to the intermediate taps T1, T2, ..., T(N) of the ladder resistance 1 inevitably needs long wiring lines, and hence the area occupied by the long wiring lines on the semiconductor chip disadvantageously becomes larger. Accordingly, there arises a problem that a large area of the semiconductor chip is inevitably needed to provide the device therein.

SUMMARY OF THE INVENTION

The present invention is directed to an analog-to-digital converter. According to a first aspect of the present invention, the analog-to-digital converter comprises: a ladder resistance having first to (N+1)th resistance elements connected in series to one another and first to N-th intermediate taps at the respective junctions of the resistance elements; a pair of differential input signal lines; first to N-th differential comparators; and an encoder for encoding a group of outputs from the first to N-th differential comparators and outputting an output signal. In the analog-to-digital converter of the first aspect, each of the first to N-th differential comparators has first to fourth input terminals and compares the difference between input signals applied to the third and fourth input terminals with the difference between input signals applied to the first and second input terminals to output an comparison result as to which is larger, the third input terminal of each of the first to N-th differential comparators is connected to one of the pair of differential input signal lines and the fourth input terminal of each of the first to N-th differential comparators is connected to the other of the pair of differential input signal lines, and the first input terminal of an i-th (i=1, ..., N) differential comparator is connected to an i-th intermediate tap and the second input terminal of the i-th differential comparator is connected to an (N+1−i)th intermediate tap. Further, in the analog-to-digital converter of the first aspect, the ladder resistance is folded back at a midpoint thereof so that a j-th (j=1, ..., N) intermediate tap and an (N+1−j)th intermediate tap are located side by side, and the first to N-th differential comparators are arranged along one side of the ladder resistance in an order such that a k-th (k is at least one of 1, ..., N) differential comparator and an (N+1−k)th differential comparator which are connected in common to k-th and (N+1−k)th intermediate taps are located adjacently to each other and nearer to the k-th and (N+1−k)th intermediate taps than any other differential comparators.

According to a second aspect of the present invention, in the analog-to-digital converter of the first aspect, the first to N-th differential comparators are arranged in an order such that an m-th (m=1, ..., N) differential comparator and an (N+1−m)th differential comparator which are connected in common to m-th and (N+1−m)th intermediate taps are located adjacently to each other and nearer to the m-th and (N+1−m)th intermediate taps than any other differential comparators.

According to a third aspect of the present invention, in the analog-to-digital converter of the second aspect, the first to N-th differential comparators are arranged to be identical or symmetrical with one another in positional relations between an n-th (n=1, ..., N) differential comparator and n-th and (N+1−n)th intermediate taps to which the n-th differential comparator is connected.

According to a fourth aspect of the present invention, in the analog-to-digital converter of the third aspect, the first to (N+1)th resistance elements are each constructed of one or more unit resistance elements of the same shape and the same resistance value, each serving as an unit constituent element.

According to a fifth aspect of the present invention, in the analog-to-digital converter of the fourth aspect, a device including the ladder resistance, the first to N-th differential comparators, the pair of differential input signal lines and the encoder which are connected to one another is defined as a first A/D conversion block. The analog-to-digital converter of the fifth aspect further comprises a second A/D conversion block having the same configuration as the first A/D conversion block. In the analog-to-digital converter of the fifth aspect, the first and second A/D conversion blocks share the ladder resistance, and the first and second A/D conversion blocks are disposed symmetrically with respect to the ladder resistance.

According to a sixth aspect of the present invention, in the analog-to-digital converter of the fifth aspect, the first and second A/D conversion blocks further share the pair of differential input signal lines, and the pair of differential input signal lines are disposed so as to be sandwiched by both sides of the folded ladder resistance.

According to a seventh aspect of the present invention, the analog-to-digital converter of the sixth aspect further comprises a multiplexer for selecting and outputting the output signal among signals outputted from the first and second A/D conversion blocks.

According to an eighth aspect of the present invention, the analog-to-digital converter of the seventh aspect further comprises a control portion for supplying the multiplexer, and the differential comparators and the encoder included in each of the first and second A/D conversion blocks with a clock signal. In the analog-to-digital converter of the eighth aspect, the control portion supplies the clock signal so that the first and second A/D conversion blocks operate in an anti-phase relation and the multiplexer selects the output signal alternately among signals outputted from the first and second A/D conversion blocks.

According to a ninth aspect of the present invention, an analog-to-digital converter comprises: a ladder resistance having first to (N+1)th resistance elements connected in series to one another and first to N-th intermediate taps at the respective junctions of the resistance elements; a pair of differential input signal lines; first to N-th differential comparators; and an encoder for encoding a group of outputs from the first to N-th differential comparators and outputting an output signal. In the analog-to-digital converter of the ninth aspect, each of the first to N-th differential comparators has first to fourth input terminals and compares the difference between input signals applied to the third and fourth input terminals with the difference between input signals applied to the first and second input terminals to output an comparison result as to which is larger, the third input terminal of each of the first to N-th differential comparators is connected to one of the pair of differential input signal lines and the fourth input terminal of each of the first to N-th differential comparators is connected to the other of the pair of differential input signal lines, and the first input terminal of an i-th (i=1, ..., N) differential comparator is connected to an i-th intermediate tap and the second input terminal of the i-th differential comparator is connected to an (N+1−i)th intermediate tap. Further, in the analog-to-digital converter of the ninth aspect, a device including the ladder resistance, the first to N-th differential comparators, the pair of differential input signal lines and the encoder which are connected to one another is defined as a first A/D conversion block. The analog-to-digital converter of the ninth aspect further comprises a second A/D conversion block having the same configuration as the first A/D conversion block. In the analog-to-digital converter of the ninth aspect, the first and second A/D conversion blocks share the ladder resistance, and the first and second A/D conversion blocks are disposed symmetrically with respect to the ladder resistance.

In the A/D converter of the first aspect, the ladder resistance is folded back at its midpoint so that a pair of intermediate taps which are connected to the same differential comparator may be located side by side, and the differential comparators are arranged along one side of the ladder resistance in the order such that at least one pair of differential comparators which are connected to the common intermediate taps may be located adjacently to each other and to be nearest to the common intermediate taps. Accordingly, wires connecting a pair of adjacent differential comparators located nearest to the common intermediate taps to the common intermediate taps becomes shorter and the area needed for wiring is thereby reduced.

In the A/D converter of the second aspect, the differential comparators are arranged along one side of the ladder resistance in the order such that all pairs of differential comparators which are connected to the common intermediate taps may be located adjacently to each other and to be nearest to the common intermediate taps. Accordingly, wires connecting all pairs of the differential comparators to the respective common intermediate taps becomes shorter and the area needed for wiring is most effectively reduced.

In the A/D converter of the third aspect, all the differential comparators are arranged to be identical or symmetrical with one another in positional relation between the differential comparator and the intermediate tap to be connected thereto, and accordingly all the differential comparators obtain a uniform property with high precision. In other words, it is possible to perform an A/D conversion with high precision.

In the A/D converter of the fourth aspect, the resistance elements are each constructed of one or more unit resistance elements of the same shape and the same resistance value as a unit constituent element, and accordingly the resistance elements of uniform resistance value with high precision are easily obtained. In other words, it is possible to perform the A/D conversion with high precision.

The A/D converter of the fifth aspect comprises the two A/D conversion blocks each having the same configuration as one of the devices of the first to fourth aspects and the two A/D conversion blocks share the ladder resistance and are arranged symmetrically with respect to the ladder resistance. Accordingly, the device of the fifth aspect can achieve the same function as two A/D converters and the two blocks have a uniform property. Further, as compared with two A/D converters, the area of the semiconductor chip needed for the device is reduced since the two blocks share the ladder resistance.

Furthermore, out of the layout information of the device of the fifth aspect, taking partly information as to one of the A/D conversion blocks provides a layout information of the device including a single A/D conversion block without difficulty. In other words, a plurality of kinds of devices share layout information, and therefore the manufacturing process is simplified.

In the A/D converter of the sixth aspect, the two A/D conversion blocks further share a pair of differential input signal lines, and accordingly further reduction in area of the semiconductor chip needed for providing the device therein is achieved.

The A/D converter of the seventh aspect comprises the multiplexer, and thereby sequentially selects the output signal among signals outputted from the two A/D conversion blocks which operate in an anti-phase relation to output it. In other words, it is possible to perform an A/D conversion with a speed substantially two times higher, beyond the limit of the operation speed inherent in each A/D conversion block.

The A/D converter of the eighth aspect comprises the control portion and accordingly has no need for externally supplying the clock signal for operating the two A/D conversion blocks and the multiplexer. Thus, it is possible to perform the A/D conversion with high speed without externally supplying the clock signal.

The A/D converter of the ninth aspect comprises the two A/D conversion blocks and the two blocks share and are arranged symmetrically with respect to the ladder resistance. Accordingly, the A/D converter of the ninth aspect can achieve the same function as two A/D converters and the two blocks have a uniform property. Further, the size of the device is reduced as compared with two A/D converters since the two blocks share the ladder resistance.

Accordingly, an object of the present invention is to provide an A/D converter which needs smaller area of the semiconductor chip therefor.

These and other objects, features, aspects and advantages of the present invention will become more apparent from the following detailed description of the present invention when taken in conjunction with the accompanying drawings.

DESCRIPTION OF THE PREFERRED EMBODIMENTS

1. The First Preferred Embodiment

As an example of an analog-to-digital (A/D) converter in accordance with the first preferred embodiment of the present invention, a three-bit output A/D converter is herein taken for description.

1-1. Circuit Configuration

Figure 1:
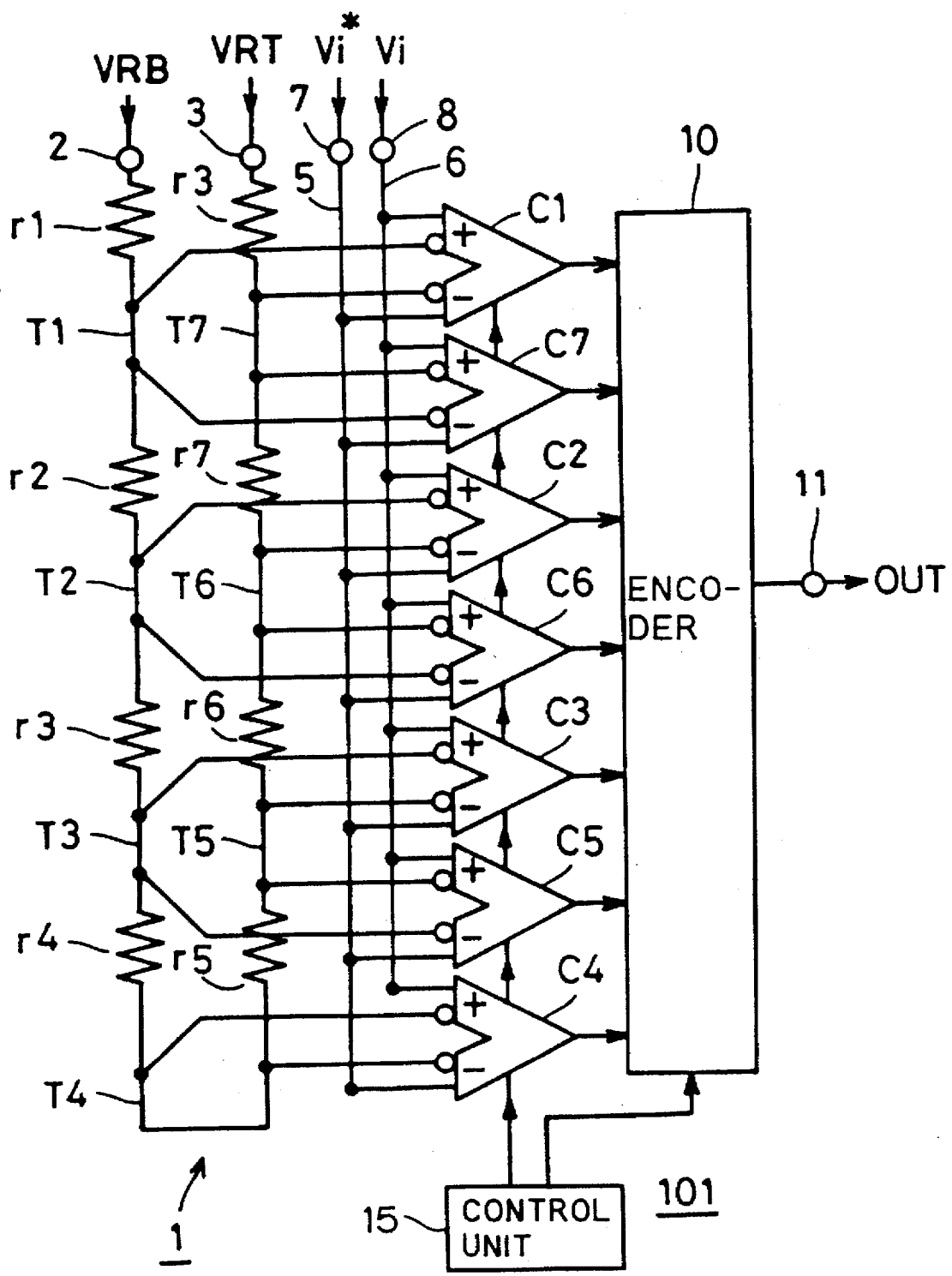
FIG. 1 is a wiring diagram of a device in accordance with a first preferred embodiment of the present invention.

FIG. 1 is a wiring diagram of a device in accordance with the first preferred embodiment. A device 101 is fabricated within a single semiconductor substrate (semiconductor chip). As shown in FIG. 1, the device 101 includes seven differential comparators C1, C2, ... , C7, each of which has four input terminals, i.e., the first to fourth input terminals. Outputs from all of the differential comparators C1, C2, ... , C7 are inputted to an encoder 10.

Each of the differential comparators C1, C2, ... , C7 has two input terminals with sign "+", one of which with the inversion mark "o" is the first input terminal and the other without the inversion mark "o" is the third input terminal, and further has two input terminals with sign "−", one of which with the inversion mark "o" is the second input terminal and the other without the inversion mark "o" is the fourth input terminal. The same will be applied to the following figures.

The device 101 further includes a ladder resistance 1. The ladder resistance 1 has a pair of terminals 2 and 3 and resistance elements r1, r2, ... , r8 connected in series to one another therebetween. At the junctions of the resistance elements r1, r2, ... , r8 provided are intermediate taps T1, T2, ... , T7, respectively.

In the differential comparator C1, the first input terminal is connected to the intermediate tap T1 provided at the junction between the resistance elements r1 and r2 and the second input terminal is connected to the intermediate tap T7 provided at the junction between the resistance elements r8 and r7. In the differential comparator C2, the first input terminal is connected to the intermediate tap T2 and the second input terminal is connected to the intermediate tap T6.

Generally discussing, in the differential comparator C(i) (i=1, ... , 7), the first input terminal is connected to the intermediate tap T(i) provided at the junction between the resistance elements r(i) and r(i+1) and the second input terminal is connected to the intermediate tap T(8−i) provided at the junction between the resistance elements r(9−i) and r(8−i). In other words, the first input terminal of the differential comparator C(i) and the second input terminal of the differential comparator C(8−i) are connected in common to the intermediate tap T(i).

The device 101 further includes a pair of differential input signal lines 5 and 6 connected to terminals 7 and 8 respectively at one ends. The third input terminal of each of the differential comparator C1, C2, ... , C7 is connected to the differential input signal line 5 and the fourth input terminal of each of the differential comparators C1, C2, ... , C7 is connected to the differential input signal line 6.

Each of the differential comparators C1, C2, ... , C7 compares the difference between an input voltage signal V3 applied to the third input terminal and an input voltage signal V4 applied to the fourth input terminal with the difference between an input voltage signal V1 applied to the first input terminal and an input voltage signal V2 applied to the second input terminal, and outputs a digital signal of high level or low level depending on the comparison result.

In other words, each of the differential comparators C1, C2, ..., C7 amplifies the difference between (V3–V4) and (V1–V2) and outputs the amplified difference. Thus, an output voltage signal $V_{out}$ outputted from each of the differential comparators is expressed as $V_{out}=G \cdot \{(V3-V4)-(V1-V2)\}$ where G represents amplification factor (>>1).

The terminals 2 and 3 are connected to an external reference voltage supply circuit. Specifically, the terminal 2 is supplied with a reference potential VRB on lower potential side and the terminal 3 is supplied with a reference potential VRT on higher potential side. The terminals 7 and 8 receive a differential pair of input voltage signals Vi and $\overline{Vi}$, respectively. The input voltage signal $\overline{Vi}$ is an inverted signal of the input voltage signal Vi.

Accordingly, each of the differential comparators C1, C2, ..., C7 compares the difference between the input voltage signals Vi and $\overline{Vi}$ with divided reference voltages (V1–V2) into which the reference voltage is divided with the ladder resistance 1 and outputs a signal of high level or low level depending on the comparison result. At least among the resistance elements r2, ..., r7, the respective resistance values are determined equivalent to one another. Accordingly, the magnitude of divided reference voltage (V1–V2) becomes larger in the order of the differential comparators C1, C2, ..., C7 at equal intervals. Thus, the differential comparators C1, C2, ..., C7 compare the difference between the input voltage signals Vi and $\overline{Vi}$ with the divided reference voltages (V1–V2) increasing in magnitude at equal intervals.

For example, if the difference between the input voltage signals Vi and $\overline{Vi}$ is higher than the divided reference voltage (V1–V2) between the intermediate taps T2 and T6 and lower than the divided reference voltage (V1–V2) between the intermediate taps T3 and T5, the difference between the input voltage signals Vi and $\overline{Vi}$ is higher than the divided reference voltages (V1–V2) applied to the differential comparators C1 and C2 and lower than the divided reference voltages (V1–V2) applied to the differential comparators C3 to C7.

Consequently, the differential comparators C1 and C2 output signals of high level and the differential comparators C3 to C7 output sisal of low level. The encoder 10 encodes these groups of signals of high level and low level from the differential comparators C1, C2, ..., C7 into a three-bit digital signal and outputs it as an output signal OUT to an output terminal 11. The device 101 includes a control unit 15, and the differential comparators C1, C2, ..., C7 and the encoder 10 perform the respective operations in synchronization with a clock signal outputted from the control unit 15.

Thus, the device 101 converts the analog differential input voltage signals Vi and $\overline{Vi}$ into a digital signal to output it. Furthermore, the device 101 may be configured so as to externally receive the clock signal without the control unit 15.

1-2. Layout

A layout inside the device 101 will now discussed below, mainly with respect to the ladder resistance 1 and the differential comparators C1, C2, ..., C7. As shown in the wiring diagram of FIG. 1, the ladder resistance 1 is folded back at its midpoint. The differential comparators C1, C2, ..., C7 are disposed along one side of the ladder resistance 1 so as to be opposed thereto. The differential comparators C1, C2, ..., C7 are arranged in the order of C1, C7, C2, C6, ..., C4 from the terminals 2 and 3 towards the intermediate tap T4, correspondingly to the ladder resistance 1 folded back at its midpoint.

Specifically, the differential comparators C(i) and C(8–i) which are connected in common to the intermediate taps T(i) and T(8–i) are disposed adjacently to each other. For example, the differential comparators C1 and C7 which share the intermediate taps T1 and T7 are disposed adjacently to each other and the differential comparators C2 and C6 which share the intermediate taps T2 and T6 are disposed adjacently to each other. Further, the adjacent differential comparators C(i) and C(8–i) are arranged to be nearer to the intermediate taps T(i) and T(8–i) than any other differential comparators.

Accordingly, the shortest wiring is made between the intermediate taps T1, T2, ..., T7 and the differential comparators C1, C2, ..., C7, respectively. Thus, it becomes possible to reduce the area of the semiconductor chip needed for arranging the wires connecting the differential comparators C1, C2, ..., C7 to the intermediate taps T1, T2, ..., T7.

Figure 2:
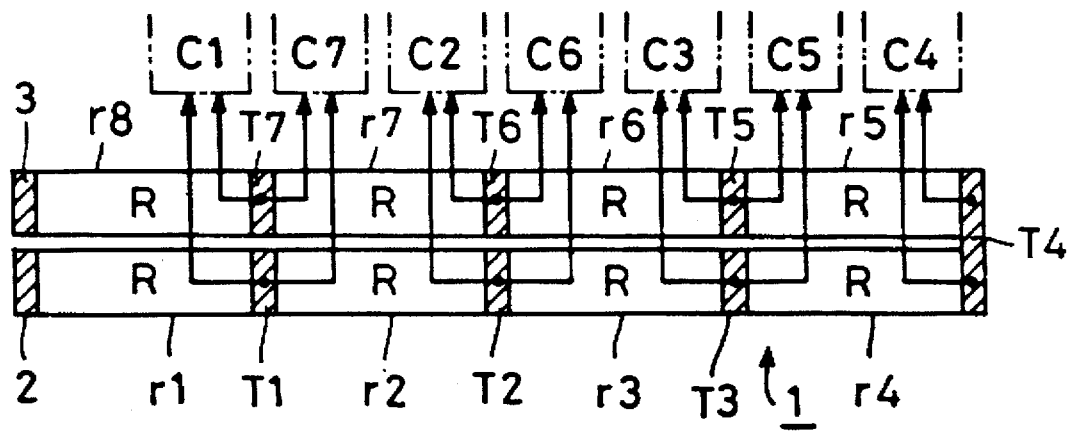
FIG. 2 is a schematic view showing a layout of the device in accordance with the first preferred embodiment of the present invention.

FIG. 2 is a schematic plan view showing an exemplary layout pattern of the ladder resistance 1 and the differential comparators C1, C2, ..., C7. As shown in FIG. 2, the ladder 1 is folded back so that the intermediate tap T4 which is the midpoint thereof may serve as one end and a pair of terminals 2 and 3 may serve as the other end. The resistance elements r1, r2, ..., r8 constituting the ladder resistance 1 are arranged in sequence along the folded two lines.

The differential comparators C1, C2, ..., C7 are aligned along the ladder resistance 1 in parallel therewith. The differential input signal lines 5 and 6 are disposed in two lines parallel with the ladder resistance 1 between the ladder resistance 1 and the differential comparators C1, C2, ..., C7 though not shown in FIG. 2 (shown in FIG. 1).

FIG. 2 shows a case where the resistance elements r1, r2, ..., r8, inclusive of r1 and r8 on both ends, are set to have the same resistance value R on design. Further, the resistance elements r1, r2, ..., r8 are arranged to have the same size. Accordingly, the resistance elements r1, r2, ..., r8 of a uniform resistance value with high precision are easily obtained.

As the ladder resistance 1 is folded at the intermediate tap T4, the resistance elements r1, ..., r4 and the resistance elements r5, ..., r8 are arranged in two lines. Further, the resistance elements r1, r2, ..., r8 are set to have the same size, and therefore two intermediate taps which are connected to the common differential comparators are arranged side by side. For example, the intermediate taps T1 and T7 which are connected in common to the differential comparators C1 and C7 are arranged side by side.

All the differential comparators C1, C2, ..., C7 are arranged to be identical or symmetrical, i.e., equivalent in positional relations with the intermediate taps T1, T2, ..., T7 to be connected thereto respectively (e.g., connection between C1 and T1 and connection between C2 and T2 are identical in positional relations, connection between C1 and T1 and connection between C7 and T1 are symmetrical in positional relations). The wires connecting the differential comparators to the intermediate taps are also arranged to be identical or symmetrical, i.e., equivalent in positional relations. Accordingly, the differential comparators C1, C2, ..., C7 of a uniform property with high precision are easily obtained. Thus, it is possible to perform an analog-to-digital (A/D) conversion with high precision.

Figure 3:
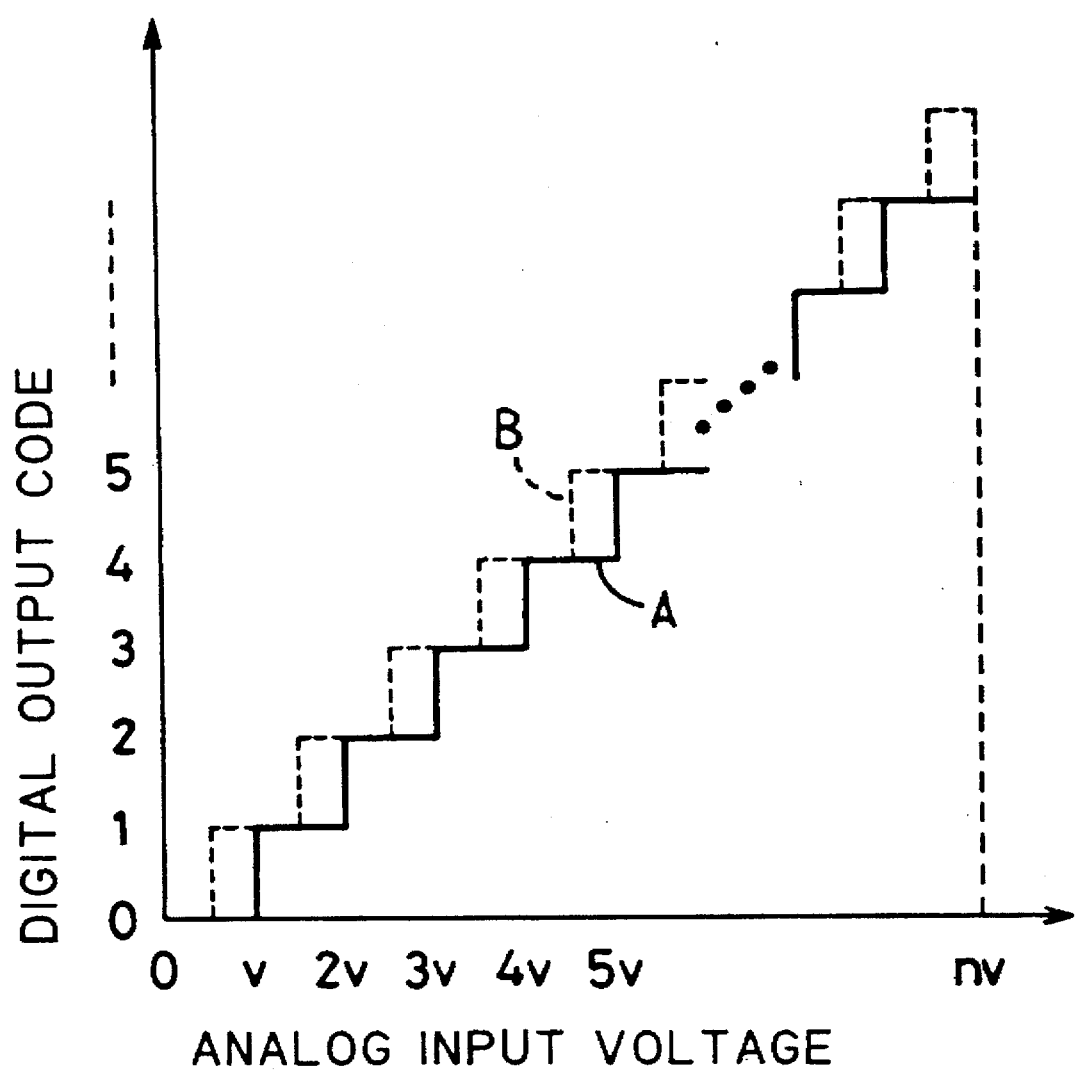
FIG. 3 is a graph showing the input/output characteristic of the device in accordance with the first preferred embodiment of the present invention.

FIG. 3 is a graph showing a relation between the analog input voltage which is the difference between the input voltage signals Vi and $\overline{Vi}$ and the digital output code indicated by the output signal OUT. In FIG. 3, for convenience, the reference potential difference (VRB–VRT) is represented by the analog input voltage of 0 and the reference potential difference (VRT–VRB) is represented by the maximum analog input voltage of nv. The maximum amplitude of the analog input voltage nv is digitized, being divided by a certain step width, to obtain a digital output signal OUT.

In general, there are two patterns of relation between the analog input voltage and the digital output code. In the first pattern as indicated by the line A of FIG. 3, the step width is constant even at both ends (0 and nv) of the maximum amplitude and in the second pattern as indicated by the line B, the step width at both ends (0 and nv) of the maximum amplitude is half as wide as the normal step width. With the ladder resistance 1 of FIG. 2, an A/D converter which has the pattern indicated by the line A is achieved.

Figure 4:
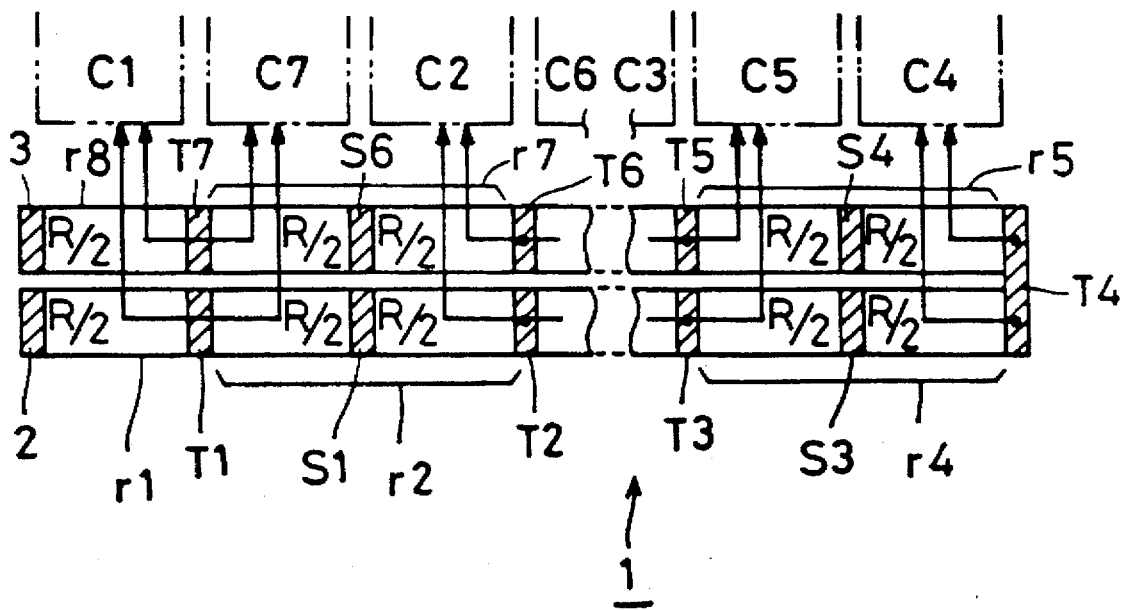
FIG. 4 is a schematic view showing another layout of the device in accordance with the first preferred embodiment of the present invention.

In contrast, with the ladder resistance 1 shown in a plan view of FIG. 4, an A/D converter which has the pattern indicated by the line B is achieved. Specifically, in the ladder resistance 1 of FIG. 4, the resistance elements r2, ..., r7 other than both ends each have the same resistance value R as those of the ladder resistance 1 of FIG. 2 and on the other hand, the resistance elements r1 and r8 on both ends each have a resistance value R/2, half as large as the resistance value R.

Even in the ladder resistance 1 having the configuration shown in FIG. 4, the resistance elements r2, ..., r7 are so disposed as to have the same size and moreover the resistance elements and the differential comparators C1, C2, ..., C7 are arranged in the same manner as those of FIG. 2. Accordingly, using the ladder resistance 1 of FIG. 4, the A/D conversion with high precision is accomplished like the case of FIG. 2.

In particular, each of the resistance elements r2, ..., r7 consists of two resistance elements r1 or r8 connected in series. Specifically, the resistance elements r1, r2, ..., r8 are each constructed of one or two unit resistance elements each having the resistance value R/2 as a unit constituent element. Accordingly, it is possible to easily achieve the resistance values with high precision in all the resistance elements r1, r2, ..., r8, like in the ladder resistance 1 of FIG. 2, although the resistance elements r1, r2, ..., r8 have different resistance values.

Furthermore, the ladder resistance 1 includes intermediate taps S1, ..., S6 for connecting the unit resistance elements in the resistance elements r2, ..., r7, respectively, as well as the intermediate taps T1, T2, ..., T7 connected to the differential comparators C1, C2, ..., C7. The intermediate taps S1, ..., S6 can be used for connection to devices other than the differential comparators C1, C2, ..., C7.

For example, in a serial-parallel A/D converter including inside an A/D converter and a D/A converter fabricated within a single semiconductor substrate, the device 101 can be used as the A/D converter which is a constituent element. In this case, the intermediate taps S1, ..., S6 are used for connection to the D/A converter.

2. The Second Preferred Embodiment

Figure 5:
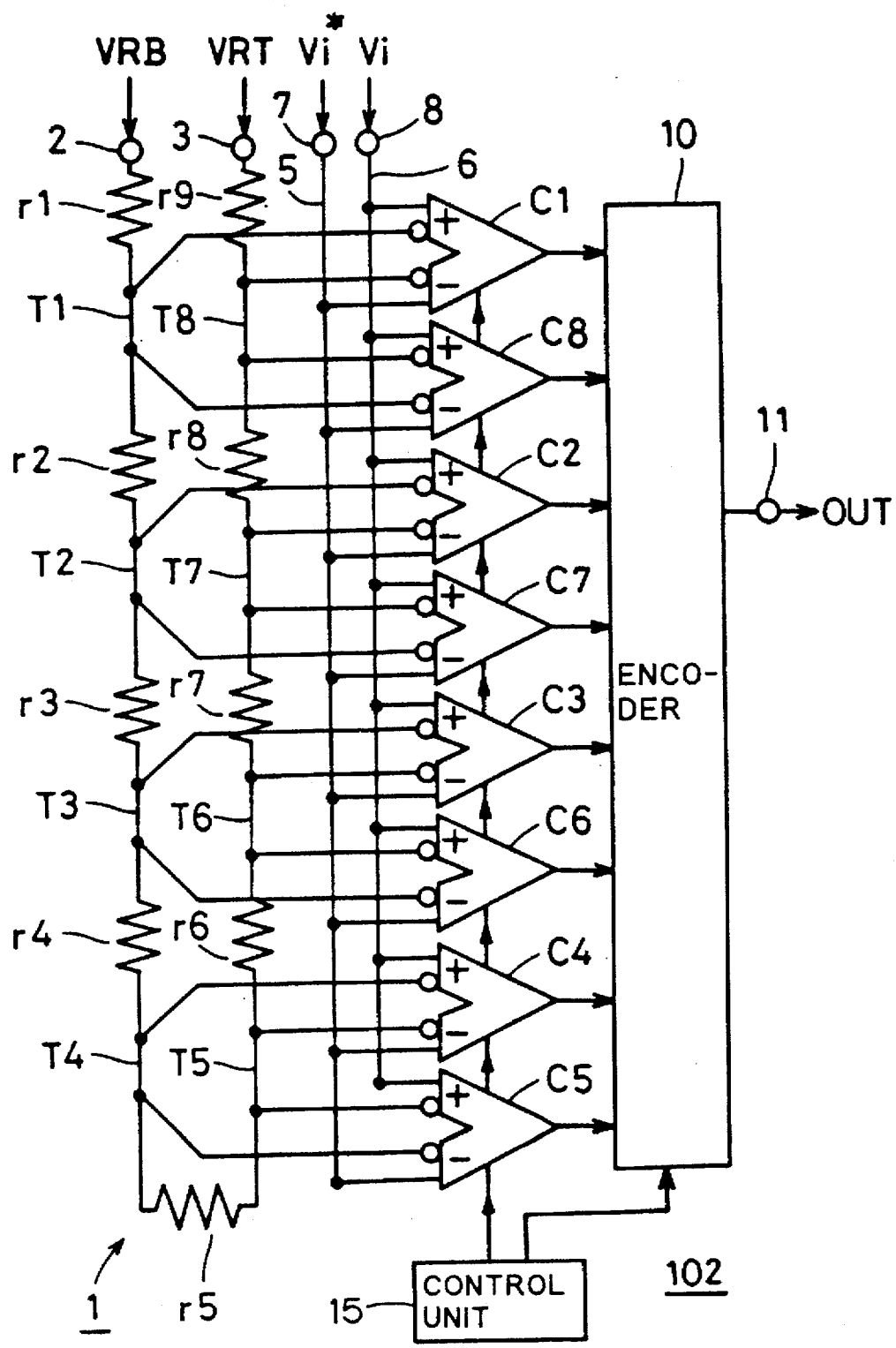
FIG. 5 is a wiring diagram of a device in accordance with a second preferred embodiment of the present invention.

FIG. 5 is a wiring diagram of an A/D converter in accordance with the second preferred embodiment. In figures hereinafter, like reference characters are given to components which are identical or corresponding (functionally identical) to those in FIG. 1 and redundant description thereof are omitted.

A device 102 outputs one-bit overflow bit (underflow bit) along with the three-bit digital numeral. Specifically, the difference between the input voltage signals Vi and $\overline{Vi}$ is converted into a three-bit digital signal and if an overflow or underflow takes place, an overflow bit of active level is outputted.

Accordingly, the device 102 includes eight differential comparators C1, C2, ..., C8. Correspondingly, the ladder resistance 1 includes nine resistance elements r1, r2, ..., r9 and further eight intermediate taps T1, T2, ..., T8 at the junctions thereof. The first input terminal of the differential comparator C(i) (i=1, ..., 8) is connected to the intermediate tap T(i) provided at the junction between the resistance elements r(i) and r(i+1) and the second input terminal is connected to the intermediate tap T(9–i) provided at the junction between the resistance elements r(10–i) and r(9–1).

In the device 102, the resistance element r5 is the midpoint of the ladder resistance 1. Accordingly, the ladder resistance 1 is folded back at the resistance element r5. The differential comparators C(i) and C(9–i) which are connected in common to the intermediate taps T(i) and T(9–i) located side by side are disposed adjacently to each other. For example, the differential comparators C2 and C7 which are connected in common to the intermediate taps T2 and T7 located side by side are disposed adjacently to each other.

Specifically, the differential comparators C1, C2, ..., C8 are so arranged as to be opposed to the ladder resistance 1 in the order of C1, C8, C2, C7, ..., C4, C5 from the terminals 2 and 3 towards the resistance element r5. Further, the adjacent differential comparators C(i) and C(9–i) are arranged to be nearer to the intermediate taps T(i) and T(9–i) to be connected thereto than any other differential comparators.

Accordingly, the shortest wiring is made between the intermediate taps T1, T2, ..., T8 and the differential comparators C1, C2, ..., C8, respectively, like in the device 101. In other words, the device 102 also achieves the effect of reducing the area of the semiconductor chip needed for arranging the wires connecting the differential comparators C1, C2, ..., C8 to the intermediate taps T1, T2, ..., T8.

Figure 6:
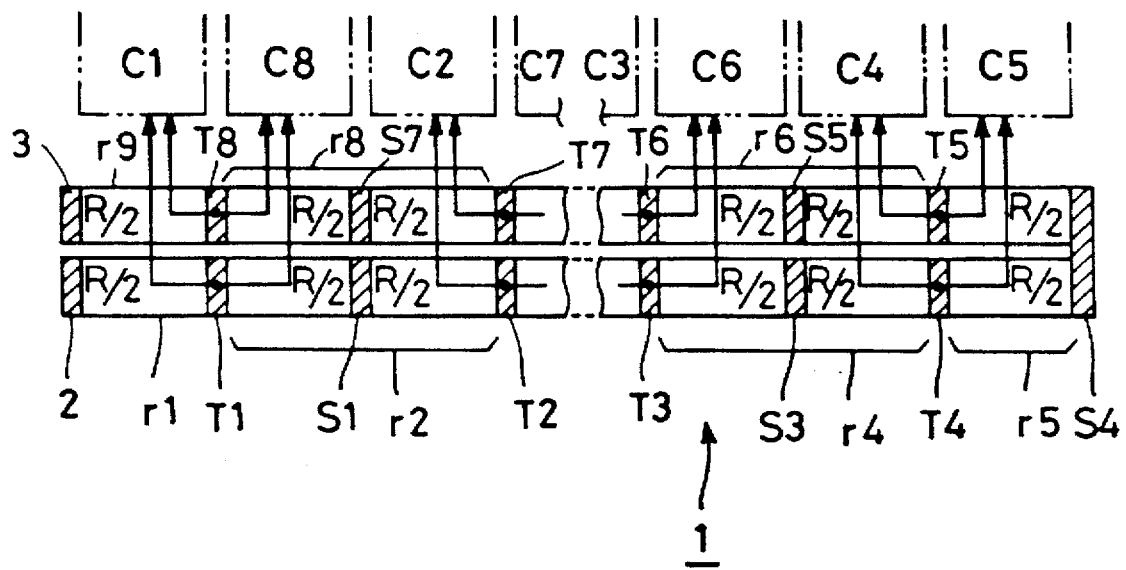
FIG. 6 is a schematic view showing a layout of the device in accordance with the second preferred embodiment of the present invention.

FIG. 6 is a schematic plan view showing an exemplary layout pattern of the ladder resistance 1 and the differential comparators C1, C2, ..., C8 in the device 102. As shown in FIG. 6, the resistance elements r2, ..., r8 other than both end resistance elements in the ladder resistance 1 each have two unit resistance elements connected in series to each other with the intermediate taps S1, ..., S7 interposed therebetween, respectively. The unit resistance elements have the same shape and the same resistance value R/2.

Accordingly, the ladder resistance 1 can be folded back at the center portion of the resistance element r5 which is the midpoint of the ladder resistance 1. Specifically, using the intermediate tap S4 in the resistance element r5 as the fold, the ladder resistance 1 can be folded back at its midpoint. In general, when the device includes an even number of differential comparators, the ladder resistance 1 can be folded back at its midpoint by using a resistance element consisting of two or an even number of unit resistance elements connected in series to one another.

Furthermore, the ladder resistance 1 of FIG. 6 includes the resistance elements r1 and r9 having only one unit resistance element on both ends so as to achieve the property indicated by the line B of FIG. 3. Naturally, the ladder resistance 1 may include the resistance elements r1 and r9 consisting of two unit resistance elements connected in series to each other like the resistance elements r2, ..., r8 so as to achieve the property indicated by the line A of FIG. 3.

Since the resistance elements r1, r2, ..., r9 of the ladder resistance 1 are each constructed of one or two unit resistance elements as a unit constituent element and the unit resistance elements are identical to one another, it is possible to easily achieve the resistance values with high precision in all the resistance elements r1, r2, ..., r9, like in the ladder resistance 1 of FIG. 4. Moreover, since all the differential comparators C1, C2, ..., C8 are arranged to be identical or symmetrical, i.e., equivalent in positional relations with the intermediate taps T1, T2, ..., T8 to be connected thereto respectively, it is possible to perform the A/D conversion with high precision, like in cases of FIG. 2 or FIG. 4.

3. The Third Preferred Embodiment

Figure 7:
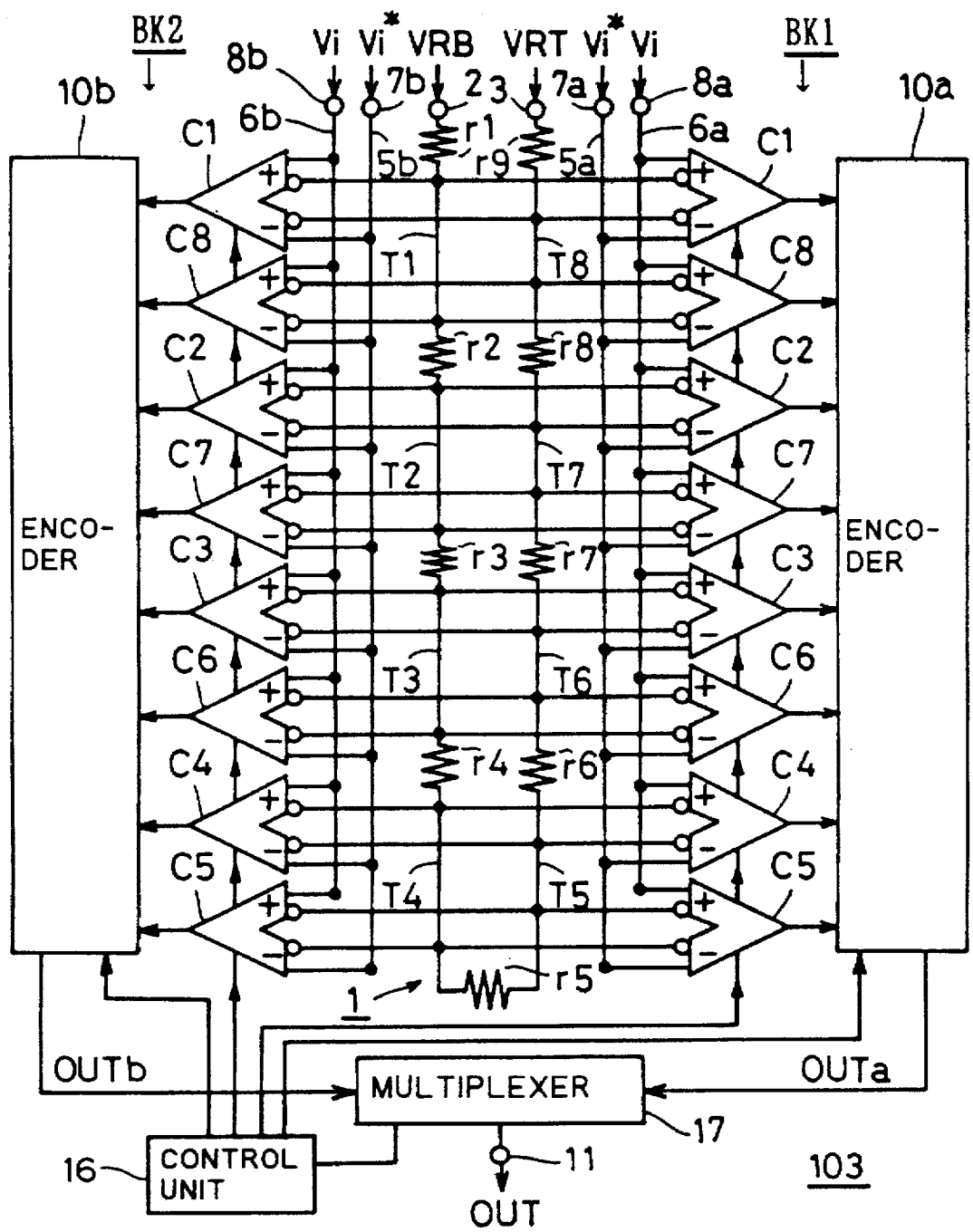
FIG. 7 is a wiring diagram of a device in accordance with a third preferred embodiment of the present invention.
Figure 8:
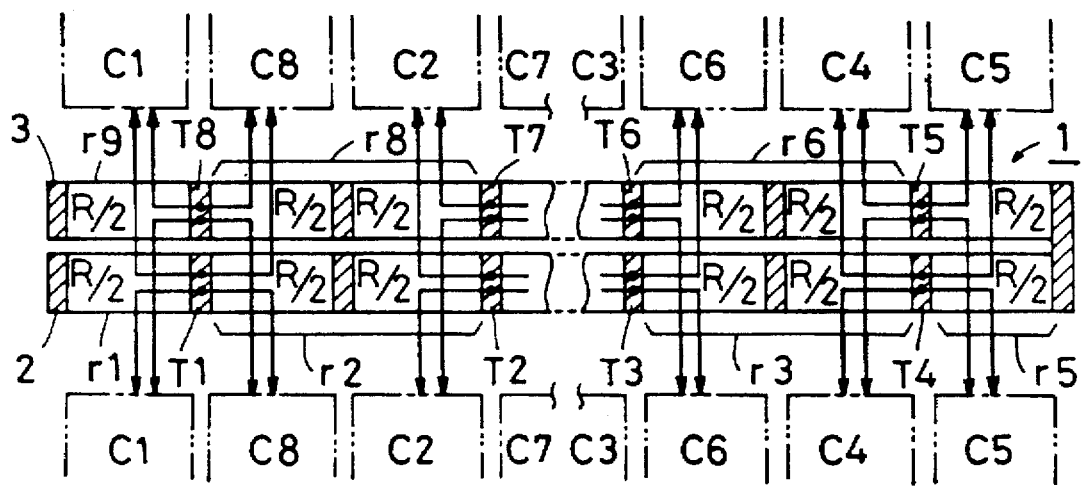
FIG. 8 is a schematic view showing a layout of the device in accordance with the third referred embodiment of the present invention.

FIGS. 7 and 8 are a wiring diagram and a schematic plan view of an A/D converter in accordance with the third preferred embodiment. A device 103 has a configuration, as shown in FIGS. 7 and 8, where a pair of the differential input signal lines 5 and 6, the differential comparators C1, C2, ..., C8 and the encoders 10 of the device 102 are arranged symmetrically with respect to the ladder resistance 1 of the device 102 interposed at the center portion.

Specifically discussing, in FIG. 7, the ladder resistance 1 and the differential input signal lines 5a and 6a, the differential comparators C1, C2, ..., C8 and the encoder 10a on the right side of the ladder resistance 1 constitute an A/D conversion block BK1 (the first A/D conversion block) which is the equivalent of the device 102. Similarly, the ladder resistance 1 and the differential input signal lines 5b and 6b, the differential comparators C1, C2, ..., C8 and the encoder 10b on the left side of the ladder resistance 1 constitute another A/D conversion block BK2 (the second A/D conversion block) which is the equivalent of the device 102.

The device 103 further includes a control unit 16 and a multiplexer 17. The multiplexer 17 alternately selects one of an output signal OUTa from the encoder 10a and an output signal OUTb from the encoder 10b in a time-division way in response to a clock signal supplied by the control unit 16 and outputs the selected one as an output signal OUT to an output terminal 11. Concurrently, the control unit 16 supplies the differential comparators C1, C2, ..., C8, and the encoder 10a (10b) of the A/D conversion block BK1 or BK2 with a clock signal so that the A/D conversion blocks BK1 and BK2 may operate in an anti-phase relation.

The respective A/D conversion blocks BK1 and BK2 alternately convert the input voltage signals Vi and $\overline{Vi}$ which are applied to the terminals 7a and 8a connected to the respective one ends of the differential input signal lines 5a and 6a and those which are applied to the terminals 7b and 8b connected to the respective one ends of the differential input signal lines 5b and 6b into digital signals respectively, and then the multiplexer 17 sequentially selects one of the digital signals to output it to the output terminal 11.

Thus, in the device 103, the anti-phase operations of this pair of A/D conversion blocks BK1 and BK2 allows improvement in speed of conversion substantially by a factor of two. Moreover, since this pair of A/D conversion blocks BK1 and BK2 share the single ladder resistance 1, these two blocks refer to the same divided reference voltages. Furthermore, this pair of A/D conversion blocks BK1 and BK2 are arranged symmetrically with respect to the ladder resistance 1, and accordingly these two blocks BK1 and BK2 have a uniform property with high precision.

Each of the A/D conversion blocks BK1 and BK2 is the equivalent of the device 102 and therefore it becomes possible to reduce the area of the semiconductor chip needed for arranging the wires connecting the differential comparators C1, C2, ..., C8 to the ladder resistance 1. In particular, it also contributes to reduction in area of the semiconductor chip that these two A/D conversion blocks BK1 and BK2 share the single ladder resistance 1. In summary, the device 103 achieves the A/D conversion with high precision and high speed while reducing the area of the semiconductor chip for providing the device therein.

Each of the A/D conversion blocks BK1 and BK2 has the same configuration as the device 102, and accordingly the data defining the layout of the device 103, namely, layout information can be utilized for the layout of the device 102. Specifically, taking only necessary part out of the layout information of the device 103 provides the layout information of the device 102. Thus, the device 103 has an advantage of sharing the layout information with the device 102.

Furthermore, although FIG. 7 shows a case where the control unit 16 is provided in the device 103, the device 103 may be so configured as to externally receive the clock signal without the control unit 16.

4. The Fourth Preferred Embodiment

Figure 9:
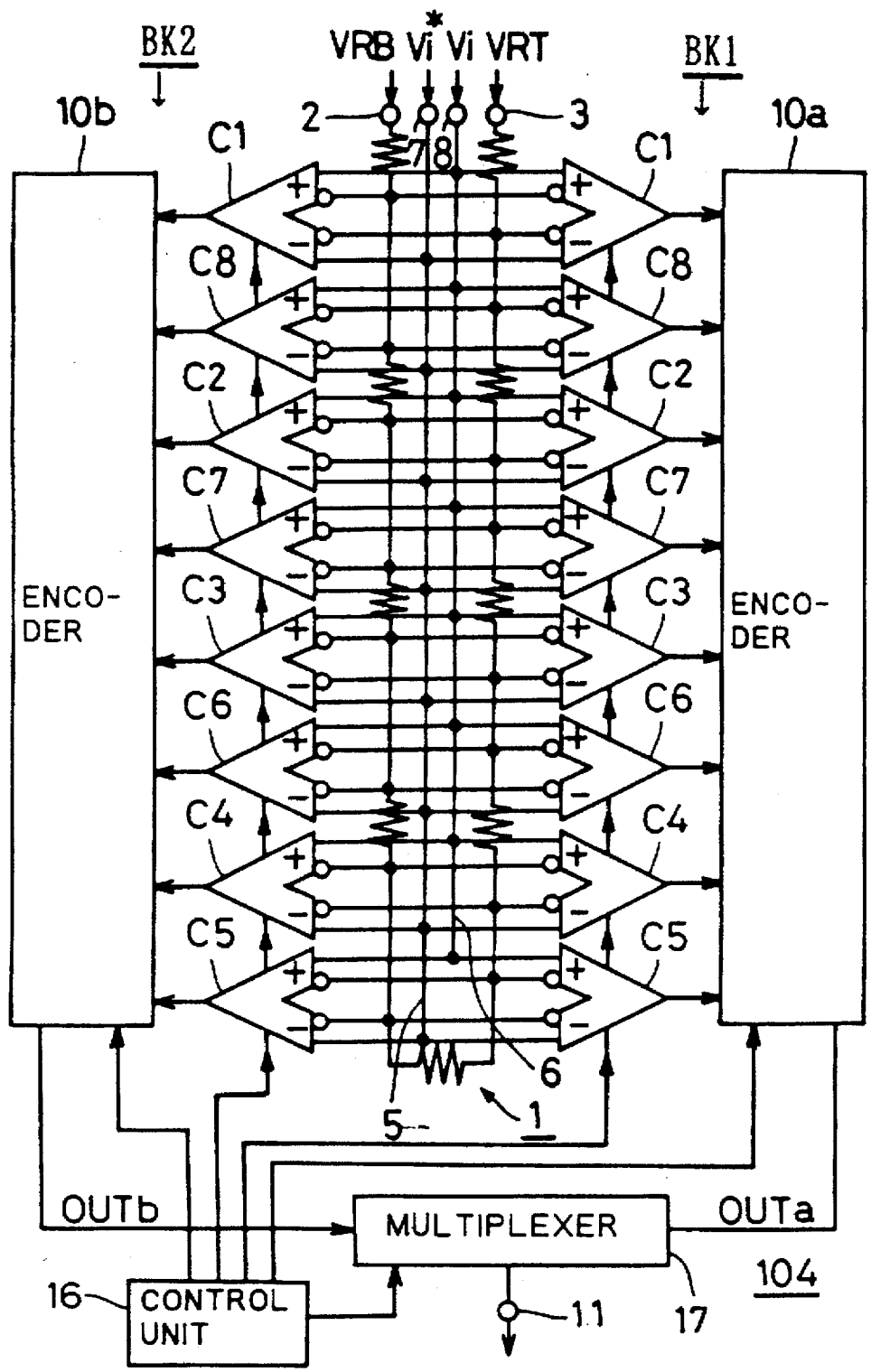
FIG. 9 is a wiring diagram of a device in accordance with a fourth preferred embodiment of the present invention.

As illustrated in FIGS. 7 and 8, the device 103 has the configuration where the two A/D conversion blocks BK1 and BK2 share the single ladder resistance 1 and are arranged symmetrically with respect to the ladder resistance 1. Therefore, the device 103 achieves the A/D conversion with high precision and high speed. FIG. 9 is a wiring diagram showing another case where the two A/D conversion blocks BK1 and BK2 are arranged under the same condition.

A device 104 of FIG. 9 is different from the device 103 characteristically in that the two A/D conversion blocks BK1 and BK2 share the differential input signal lines 5 and 6 as well as the ladder resistance 1. Specifically discussing, in the device 104, single differential input signal lines 5 and 6 are disposed at the center portion of the two A/D conversion blocks BK1 and BK2 so as to be sandwiched by the folded ladder resistance 1.

In the device 104, the two A/D conversion blocks BK1 and BK2 share the single ladder resistance 1 and are arranged symmetrically with respect thereto, like in the device 103. Accordingly, the device 104 also achieves an A/D conversion with high precision and high speed, like the device 103. Moreover, the two A/D conversion blocks BK1 and BK2 share the single differential input signal lines 5 and 6, and therefore the area of the semiconductor chip needed for arranging the differential input signal lines 5 and 6 is reduced. In summary, the device 104 can be provided in still smaller area of the semiconductor chip.

5. The Fifth Preferred Embodiment

Figure 10:
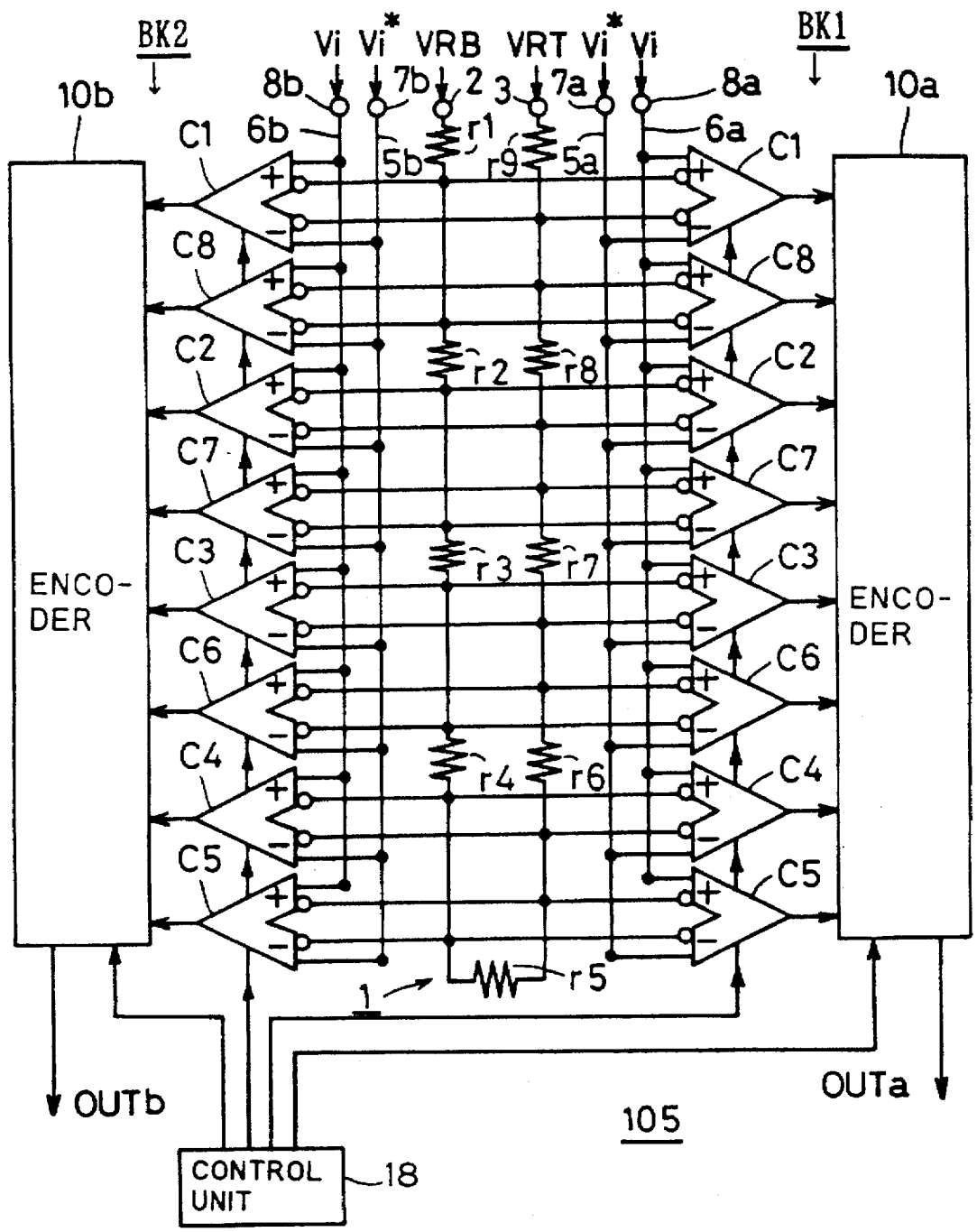
FIG. 10 is a wiring diagram of a device in accordance with a fifth preferred embodiment of the present invention.
Figure 11:
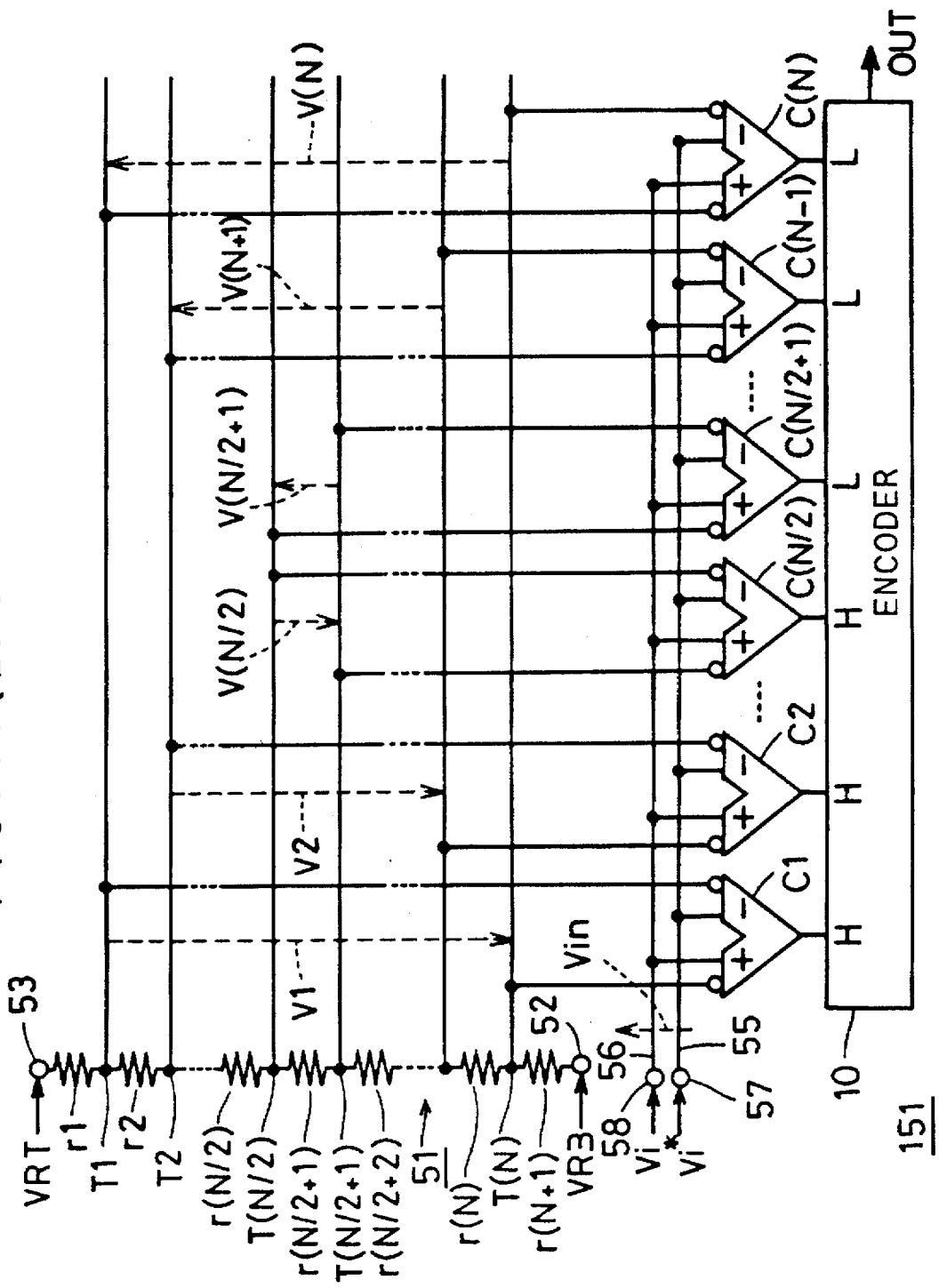
FIG. 11 is a wiring diagram of a device in a background art.

FIG. 10 is a wiring diagram of an A/D converter in accordance with the fifth preferred embodiment. In the device 105 of FIG. 10, the two A/D conversion blocks BK1 and BK2 are provided in the same manner as those in the device 103. The device 105 is different from the device 103 characteristically in that it includes no multiplexer 17 and includes a control unit 18 which is different in function from the control unit 16 of the device 103. The control unit 18 supplies the differential comparators C1, C2, ..., C8, and the encoder 10a (10b) of the A/D conversion block BK1 or BK2 with the clock signal so that the A/D conversion blocks BK1 and BK2 may operate in a certain phase relation (in-phase or π/2 out-of-phase).

In recent, a semiconductor device requiring two A/D converters of the same property, such as a multi-modulating demodulator, has appeared. The device 105, in which the two A/D conversion blocks BK1 and BK2 have a uniform property with high precision, is suitable for the above application device. The device 105 in which the two A/D conversion blocks BK1 and BK2 operate in a π/2-out-of-phase relation is especially suitable for the multi-modulating demodulator. Moreover, the device 105 achieves an effect of reducing the area of the semiconductor chip for providing elements therein since the A/D conversion blocks BK1 and BK2 share some elements, e.g., the ladder resistance 1.

Furthermore, the device 105 may be so configured as to externally receive the clock signal without the control unit 18. Such a clock signal as allows independent operations of the A/D conversion blocks BK1 and BK2 may be externally applied. In other words, the A/D conversion blocks BK1 and BK2 may be used as if these blocks were two independent A/D converters.

6. Variations (1) In the above preferred embodiments, all the differential comparators are disposed so as to be nearest to the respective intermediate taps to be connected thereto in the ladder resistance 1. In general, only if at least one pair of differential comparators which are connected to the common intermediate taps are disposed to be nearest to the common intermediate taps, the effect of reducing the area of the semiconductor chip needed for providing the device therein is appropriately achieved as compared with the background-art device 151.

For example, in the device 101 of FIG. 1, there may be a configuration where only the differential comparators C1 and C7 are disposed adjacently to be nearest to the intermediate taps T1 and T7 and the remaining differential comparators C2, . . . , C6 are arranged in the order of C2, C3, . . . , C6 like in the background-art device 151. This configuration also allows remarkable reduction in area of the semiconductor chip needed for arranging the wires connecting the differential comparators C1 and C7 to the ladder resistance 1.

The configuration of the device 101 of FIG. 1, where all the differential comparators are disposed so as to be nearest to the intermediate taps to be connected thereto in the ladder resistance 1 and to have an equivalent pattern in positional relation with the intermediate taps to be connected thereto respectively, can however most effectively reduce the area of the semiconductor chip needed for providing the device therein and achieve a further advantage that all the differential comparators have a uniform property with high precision.

(2) In the devices of FIGS. 7 to 10, the two A/D conversion blocks BK1 and BK2 sharing the ladder resistance 1 each have the same configuration as the device 102 of FIG. 102. Specifically, the ladder resistance 1 is folded back at its midpoint, and the differential comparators C1, C2, . . . , C8 in each of the A/D conversion blocks BK1 and BK2 are disposed so as to be nearest to the intermediate taps T1, T2, . . . , T8 to be connected thereto and to have an equivalent pattern in positional relation with the intermediate taps to be connected thereto respectively.

Even if the ladder resistance 1 is not folded back, however, it is possible to at least provide the A/D converter which includes the two A/D conversion blocks BK1 and BK2 having a uniform property only if the A/D conversion blocks BK1 and BK2 share the ladder resistance 1 and are arranged symmetrically with respect to the ladder resistance 1. Further, the effect of reducing the area of the semiconductor chip needed for providing the shared elements such as the ladder resistance 1 therein is achieved.

For example, in the background-art device 151, there may be a configuration where the differential input signal lines 55 and 56, the differential comparators C1, C2, . . . , C(N) and the encoder 10 and the like elements are disposed symmetrically with respect to the ladder resistance 51 interposed therebetween. This configuration also achieves an advantage that the A/D conversion blocks BK1 and BK2 have a uniform property. Further, since the two A/D conversion blocks BK1 and BK2 share the single ladder resistance 51, the area of the semiconductor chip needed for providing the device therein is reduced as compared with two devices 151.

While the invention has been shown and described in detail, the foregoing description is in all aspects illustrative and not restrictive. It is therefore understood that numerous modifications and variations can be devised without departing from the scope of the invention.

We claim:

1. An analog-to-digital converter, comprising:

a ladder resistance having first to (N+1)th resistance elements connected in series to one another and first to N-th intermediate taps at the respective junctions of said resistance elements;

a pair of differential input signal lines;

first to N-th differential comparators; and an encoder for encoding a group of outputs from said first to N-th differential comparators and outputting an output signal, wherein each of said first to N-th differential comparators has first to fourth input terminals and compares the difference between input signals applied to said third and fourth input terminals with the difference between input signals applied to said first and second input terminals to output an comparison result as to which is larger, said third input terminal of each of said first to N-th differential comparators is connected to one of said pair of differential input signal lines and said fourth input terminal of each of said first to N-th differential comparators is connected to the other of said pair of differential input signal lines, and said first input terminal of an i-th (i=1, . . . , N) differential comparator is connected to an i-th intermediate tap and said second input terminal of said i-th differential comparator is connected to an (N+1−i)th intermediate tap, and wherein said ladder resistance is folded back at a midpoint thereof so that a j-th (j=1, . . . , N) intermediate tap and an (N+1−j)th intermediate tap are located side by side, and said first to N-th differential comparators are arranged along one side of said ladder resistance in an order such that a k-th (k is at least one of 1, . . . , N) differential comparator and an (N+1−k)th differential comparator which are connected in common to k-th and (N+1−k)th intermediate taps are located adjacently to each other and nearer to said k-th and (N+1−k)th intermediate taps than any other differential comparators.

2. The analog-to-digital converter of claim 1, wherein said first to N-th differential comparators are arranged in an order such that an m-th (m=1, . . . , N) differential comparator and an (N+1−m)th differential comparator which are connected in common to m-th and (N+1−m)th intermediate taps are located adjacently to each other and nearer to said m-th and (N+1−m)th intermediate taps than any other differential comparators.

3. The analog-to-digital converter of claim 2, wherein said first to N-th differential comparators are arranged to be identical or symmetrical with one another in positional relations between an n-th (n=1, ..., N) differential comparator and n-th and (N+1−n)th intermediate taps to which said n-th differential comparator is connected.

4. The analog-to-digital converter of claim 3, wherein said first to (N+1)th resistance elements are each constructed of one or more unit resistance elements of the same shape and the same resistance value, each serving as an unit constituent element.

5. The analog-to-digital converter of claim 4, wherein said second to N-th resistance elements each include a series circuit consisting of said unit resistance elements connected in series with another intermediate tap interposed therebetween which is different from said first to N-th intermediate taps.

6. The analog-to-digital converter of claim 5, wherein the number of said unit resistance elements constituting said series circuit is the same among all of said second to N-th resistance elements.

7. The analog-to-digital converter of claim 6, wherein said midpoint of said ladder resistance at which said ladder resistance is folded back is any one of said first to N-th intermediate taps.

8. The analog-to-digital converter of claim 6, wherein said midpoint of said ladder resistance at which said ladder resistance is folded back is said another intermediate tap in said series circuit of any one of said second to N-th resistance elements.

9. The analog-to-digital converter of claim 6, wherein said ladder resistance is disposed linearly being folded back, and said first to N-th differential comparators are disposed linearly in parallel with said ladder resistance.

10. The analog-to-digital converter of claim 9, wherein said pair of differential input signal lines are disposed linearly in parallel with said ladder resistance.

11. The analog-to-digital converter of claim 10, wherein said pair of differential input signal lines are disposed between said ladder resistance and a row of said first to N-th differential comparators.

12. The analog-to-digital converter of claim 11, further comprising:
a control portion for supplying said differential comparators and said encoder with a clock signal.

13. The analog-to-digital converter of claim 4, wherein a device including said ladder resistance, said first to N-th differential comparators, said pair of differential input signal lines and said encoder which are connected to one another is defined as a first A/D conversion block, said analog-to-digital converter further comprising a second A/D conversion block having the same configuration as said first A/D conversion block, and wherein said first and second A/D conversion blocks share said ladder resistance, and said first and second A/D conversion blocks are disposed symmetrically with respect to said ladder resistance.

14. The analog-to-digital converter of claim 13, wherein said first and second A/D conversion blocks further share said pair of differential input signal lines, and said pair of differential input signal lines are disposed so as to be sandwiched by both sides of said folded ladder resistance.

15. The analog-to-digital converter of claim 14, further comprising:
a multiplexer for selecting and outputting said output signal among signals outputted from said first and second A/D conversion blocks.

16. The analog-to-digital converter of claim 13, wherein each of said first and second A/D conversion blocks is characterized in that
said second to N-th resistance elements each include a series circuit consisting of said unit resistance elements connected in series with another intermediate tap interposed therebetween which is different from said first to N-th intermediate taps,
the number of said unit resistance elements constituting said series circuit is the same among all of said second to N-th resistance elements,
said ladder resistance is disposed linearly being folded back,
said first to N-th differential comparators are disposed linearly in parallel with said ladder resistance,
said pair of differential input signal lines are disposed linearly in parallel with said ladder resistance, and
said pair of differential input signal lines are disposed between said ladder resistance and a row of said first to N-th differential comparators.

17. The analog-to-digital converter of claim 15, further comprising:
a control portion for supplying said multiplexer, and said differential comparators and said encoder included in each of said first and second A/D conversion blocks with a clock signal,
wherein said control portion supplies said clock signal so that said first and second A/D conversion blocks operate in an anti-phase relation and said multiplexer selects said output signal alternately among signals outputted from said first and second A/D conversion blocks.

18. The analog-to-digital converter of claim 13, further comprising:
a control portion for supplying said differential comparators and said encoder included in each of said first and second A/D conversion blocks with a clock signal,
wherein said control portion supplies said clock signal so that said first and second A/D conversion blocks operate in a certain phase relation.

19. The analog-to-digital converter of claim 18, wherein said certain phase relation is a $\pi/2$-out-of-phase relation.

20. An analog-to-digital converter, comprising:
a ladder resistance having first to (N+1)th resistance elements connected in series to one another and first to N-th intermediate taps at the respective junctions of said resistance elements;
a pair of differential input signal lines;
first to N-th differential comparators; and
an encoder for encoding a group of outputs from said first to N-th differential comparators and outputting an output signal,
wherein each of said first to N-th differential comparators has first to fourth input terminals and compares the difference between input signals applied to said third and fourth input terminals with the difference between input signals applied to said first and second input terminals to output an comparison result as to which is larger,
said third input terminal of each of said first to N-th differential comparators is connected to one of said pair of differential input signal lines and said fourth input terminal of each of said first to N-th differential comparators is connected to the other of said pair of differential input signal lines, and said first input terminal of an i-th (i=1, ..., N) differential comparator is connected to an i-th intermediate tap and said second input terminal of said i-th differential comparator is connected to an (N+1−i)th intermediate tap, and wherein a device including said ladder resistance, said first to N-th differential comparators, said pair of differential input signal lines and said encoder which are connected to one another is defined as a first A/D conversion block, said analog-to-digital converter further comprising a second A/D conversion block having the same configuration as said first A/D conversion block, and wherein said first and second A/D conversion blocks share said ladder resistance, and said first and second A/D conversion blocks are disposed symmetrically with respect to said ladder resistance.

* * * * *